(12) United States Patent
Kurita et al.

(10) Patent No.: US 7,060,597 B2
(45) Date of Patent: Jun. 13, 2006

(54) MANUFACTURING METHOD FOR A SILICON SUBSTRATE HAVING STRAINED LAYER

(75) Inventors: Hisatsugu Kurita, Niigata (JP); Masato Igarashi, Niigata (JP); Takeshi Senda, Niigata (JP); Koji Izunome, Niigata (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 93 days.

(21) Appl. No.: 10/847,305

(22) Filed: May 18, 2004

(65) Prior Publication Data

US 2004/0235274 A1   Nov. 25, 2004

(30) Foreign Application Priority Data

May 19, 2003   (JP) .............................. 2003-140274
May 26, 2003   (JP) .............................. 2003-147311

(51) Int. Cl.
   *H01L 21/20* (2006.01)
(52) U.S. Cl. ...................... 438/504; 257/616; 257/623; 117/97
(58) Field of Classification Search ................ 438/481, 438/504; 257/616, 623; 117/97, 45
   See application file for complete search history.

(56) References Cited

U.S. PATENT DOCUMENTS

| | | | |
|---|---|---|---|
| 5,422,306 A * | 6/1995 | Niwa et al. .................. | 438/393 |
| 6,083,812 A * | 7/2000 | Summerfelt ................. | 438/481 |
| 6,121,121 A * | 9/2000 | Koide ......................... | 438/481 |
| 6,153,010 A * | 11/2000 | Kiyoku et al. ................ | 117/95 |
| 6,165,874 A * | 12/2000 | Powell et al. ................ | 438/478 |
| 6,180,497 B1 | 1/2001 | Sato et al. | |
| 6,583,015 B1 * | 6/2003 | Fitzgerald et al. ........... | 438/287 |
| 2002/0008289 A1 * | 1/2002 | Murota et al. ............... | 257/369 |
| 2003/0025131 A1 * | 2/2003 | Lee et al. .................... | 257/200 |
| 2004/0142541 A1 * | 7/2004 | Cohen et al. ................ | 438/479 |
| 2004/0259333 A1 * | 12/2004 | Tomasini et al. ............ | 438/478 |

FOREIGN PATENT DOCUMENTS

| | | |
|---|---|---|
| JP | 6-252046 A | 9/1994 |
| JP | 07-037811 A | 2/1995 |
| JP | 2003-078116 A | 3/2003 |
| JP | 2003-078118 A | 3/2003 |
| KR | 2000-0011946 A | 2/2000 |

* cited by examiner

*Primary Examiner*—Bradley K. Smith
*Assistant Examiner*—Steven J Fulk
(74) *Attorney, Agent, or Firm*—Foley & Lardner LLP (57) ABSTRACT

A manufacturing method for a silicon substrate having a strained layer, has steps of forming a plurality of atomic steps having a height of 0.1 nm or more on the surface of a silicon substrate, forming a plurality of terraces having a width of 0.1 μm or more between the plurality of atomic steps and forming a SiGe layer or a SiGe layer and a Si layer on the silicon substrate.

12 Claims, 4 Drawing Sheets

MANUFACTURING METHOD FOR A SILICON SUBSTRATE HAVING STRAINED LAYER

The present invention claims foreign priority to Japanese patent applications no. JP-2003-140274 and JP-2003-147311, filed on May 19, 2003 and May 26, 2003, respectively, the contents of which is incorporated herein by reference.

BACKGROUND OF THE INVENTION

1. Field of the Invention

The present invention relates to a manufacturing method for a strained silicon substrate wafer and more particularly to manufacturing method for a strained silicon substrate wafer having a lower threading dislocation and defect density than ever.

2. Description of the Related Art

In recent years, there has been a growing demand for high speed semiconductor devices requiring reduced consumption power. However, further enhancement of performance of devices by drastic scale reduction of devices, i.e., drastic reduction of dimension of element and fine division of element has been already physically limited.

Therefore, as a substrate for forming high speed semiconductor devices requiring reduced consumption power, there has been noted a semiconductor substrate having a strained silicon layer. In particular, a high speed device comprising as a channel region of a strained silicon layer (hereinafter referred to as "strain Si layer") obtained by allowing silicon to undergo epitaxial growth on a silicon substrate with a silicon-germanium layer (hereinafter referred to as "SiGe layer") interposed therebetween has been proposed and noted.

An MOS device comprising a Si/SiGe heterostructure has been noted as a favorable technique in the art of high driving power transistor requiring reduced consumption power because the channel mobility can be enhanced.

Further, the strain Si channel formed by allowing a Si layer to undergo epitaxial growth on a SiGe layer can provide a high current driving power regardless of which it is n-type or p-type. Therefore, a semiconductor substrate having a strain Si layer formed on a SiGe layer has been expected as a strain Si MOSFET technique.

This Si strained layer undergoes tensile strain caused by the SiGe layer having a greater lattice constant than silicon. This strain causes the change of the band structure of Si, releasing degeneration and hence enhancing carrier mobility.

Accordingly, the use of this strain Si layer as a channel region makes it possible to raise the carrier mobility by a factor of 1.5 or more rather than the use of bulk Si.

In order to obtain a good quality strain Si layer, it is necessary that a SiGe layer having a good quality, i.e., strain-relaxed SiGe layer having low threading dislocation and defect densities and a smooth surface be allowed to undergo epitaxial growth on the silicon substrate.

However, when a SiGe layer having a Ge composition ratio of 30% is formed directly on the silicon substrate, misfit dislocation is formed by strain energy because there is about 4% of crystalline lattice mismatching between Si and Ge. Many threading dislocations are then climbed up to Si channel layer, deteriorating the quality of crystal. It is thus made obvious that these threading dislocations cause the reduction of carrier mobility.

In the case where epitaxial growth is effected in a normal state, it goes without saying that even if the surface of Si is oxidized or annealed at high temperature before epitaxial growth, threading dislocation or misfit dislocation often occurs during epitaxial growth, making it impossible to obtain a good epitaxially grown layer.

Accordingly, it is desired to reduce the threading dislocation density to be climbed up to Si channel layer.

In the related art, in order to reduce the aforementioned threading dislocation, a process has been employed which comprises forming a graded SiGe layer which increases its Ge composition ratio with the thickness of growth on a silicon substrate, allowing the generation of dislocation in the composition graded layer to relax lattice, forming an SiGe buffer layer having a constant Ge composition ratio on the SiGe composition graded layer, and then forming a strain Si layer on the SiGe buffer layer (see, e.g., Japanese Patent Unexamined Publication JP-A-6-252046).

Further, a process has been proposed which comprises allowing epitaxial growth with a gradient of Ge concentration in the direction of thickness of SiGe layer to relax the magnitude of stain caused by the difference of lattice constant within a tolerance of generation of misfit dislocation.

As a proposal from the same idea as mentioned above, there is disclosed in Japanese Patent Unexamined Publication JP-A-2003-78116 and JP-A-2003-78118 (line 20, 5th column—line 28, 6th column page 4), an invention which comprises forming an SiGe layer in stages where the concentration of Ge has a gradation to inhibit frequent generation of dislocation by lattice mismatching.

However, even when this process is used to raise the concentration of Ge to 0.3 or more, the gradient of concentration becomes steep, making it impossible to inhibit the generation of dislocation to a satisfactory extent.

The thickness of the strain relaxation layer formed to avoid these unmetastable problems reaches about 3 μm (critical layer thickness), causing a new disadvantage that a crosshatched unevenness is formed on the surface of the SiGe layer in addition to poor production efficiency.

However, the sum of the thickness of SiGe composition graded layer and SiGe buffer layer having a constant composition is needed to be several micrometers. The formation of such a thick SiGe layer requires much time. Thus, the aforementioned process can difficultly be considered to be a proper process which can be industrially made the use of from the standpoint of production efficiency and cost as well.

Thus, a technique for effectively generating dislocation while the thickness of SiGe layer is low to relax strain has been desired.

As mentioned above, the related art technique is not capable of inhibiting the generation of misfit dislocation during epitaxial growth even if the surface of the silicon substrate is oxidized or annealed at high temperature before the epitaxial growth of SiGe layer.

Further, even when epitaxial growth is affected with a gradient of Ge concentration, threading dislocation occurs and defects such as generation of crosshatched unevenness on the surface of SiGe layer cannot be avoided.

Under these circumstances, it has been keenly desired to develop an effective means of preventing the generation of misfit dislocation and threading dislocation during epitaxial growth in the aforementioned process for the production of a strained silicon substrate wafer.

SUMMARY OF THE INVENTION

The invention has been worked out to solve the aforementioned technical problems. An aim of the invention is to provide a manufacturing method for a silicon substrate comprising a strained layer having an SiGe layer capable of reducing the thickness of the SiGe layer as well as relaxing the strained layer and reducing the threading dislocation density and other type of defect density.

The first invention concerns a manufacturing method for a silicon substrate having a strained layer having a step of forming a plurality of atomic steps having a height of 0.1 nm or more on the surface of a silicon substrate and forming a plurality of terraces having a width of 0.1 µm or more between the plurality of atomic steps and a step of forming an SiGe layer or an SiGe layer and an Si layer on the silicon substrate.

The second invention according to the first aspect of the present invention concerns a manufacturing method for a silicon substrate having a strained layer wherein the plurality of steps and plurality of terrace structures on the surface of the silicon substrate have a strained layer formed at heat treatment.

The step and terrace structure makes it possible to effectively generate dislocation and hence relax strain even if the strain relaxation layer is thin.

The third invention concerns a manufacturing method for silicon substrate having a step of forming a plurality of protrusions made of crystalline silicon on a silicon substrate and forming a SiGe layer or a SiGe layer and a Si layer on the silicon substrate.

In accordance with the invention, the regular shape of the surface of the silicon substrate makes it possible to uniformly control dislocation as made by the step and terrace structure.

The fourth invention according to the third aspect of the present invention concerns a manufacturing method for a silicon substrate having a strained layer further having a step of cleaning with ozonized water and HF solution to form the crystalline silicon protrusions on the silicon substrate after subjecting the silicon substrate to hydrogen or Ar annealing at a high temperature.

In accordance with the aforesaid process, the shape and density of the protrusion of crystalline silicon can be controlled by adjusting the time of cleaning with HF and the protrusions can be uniformly shaped.

The fifth invention according to the third aspect of the present invention concerns a manufacturing method for a silicon substrate having a strained layer, wherein the protrusions of crystalline silicon have a height ranging from 0.2 nm to 1.0 nm, a width ranging from 10 nm to 150 nm and an in-plane density ranging from $1 \times 10^{19}$ to $5 \times 10^{10}/cm^2$.

From the standpoint of relaxation of strain of SiGe layer, the protrusion preferably has the aforementioned shape and density.

The sixth invention according to the third aspect of the present invention concerns a manufacturing method for a silicon substrate having a strained layer further having a step of forming a strained layer after oxidizing the protruding portion of the crystalline silicon.

In accordance with the aforementioned process, too, the generation of threading dislocation can be effectively inhibited, making it possible to reduce the thickness of SiGe layer.

The seventh invention according to the sixth aspect of the present invention concerns a manufacturing method for a silicon substrate having a strained layer, further having a step of forming the strain relaxation layer after allowing Ge to undergo epitaxial growth in island pattern at sites other than the protruding portion of the oxidized crystalline silicon.

In accordance with the aforesaid process, too, the generation of threading dislocation can be effectively inhibited similarly, making it possible to reduce the thickness of SiGe layer.

The eighth invention according to the sixth aspect of the present invention concerns a manufacturing method for a silicon substrate having a strained layer, further having a step of subjecting the silicon substrate to cleaning with ozonized water to oxidize the protruding portion of the crystalline silicon after subjecting the silicon substrate to cleaning with HF solution to remove the oxide layer.

In order to relax the strained SiGe layer by selectively oxidize only the regularly formed protrusion portion, it is preferred that an oxide layer be formed on sites other than the protrusion portion.

The ninth invention concerns a manufacturing method for a silicon substrate having a strained layer having a step of forming an island-patterned layer having a thickness ranging from 10 nm to 400 nm and a width ranging from 10 nm to 1,000 nm on the crystalline silicon substrate, a step of allowing a strain relaxation layer to undergo epitaxial growth on the island-patterned silicon layer to a thickness ranging from 10 nm to 200 nm and a step of forming a strained silicon layer having lattice strain on the strain relaxation layer to a thickness ranging from 10 nm to 50 nm.

In this manner, a strain relaxation layer on the basis of which a good quality Si layer is formed can be allowed to undergo epitaxial growth in a suitable stain-relaxed state with little or no threading dislocation and might dislocation.

When the thickness of the island-patterned silicon layer is less than 10 nm, the island-patterned silicon layer generates no threading dislocation, making it impossible to sufficiently relax the strained layer epitaxially grown on the island-patterned silicon layer. On the contrary, when the thickness of the island-patterned silicon layer is more than 400 nm, the strain relaxation layer on the island-patterned silicon layer undergoes polycrystallization to disadvantage.

Accordingly, it is preferred that the thickness of the island-patterned silicon layer be from 10 nm to 400 nm. Further, if the width of the island-patterned silicon layer is less than 10 nm, the adjacent island-patterned silicon layers are connected to each other when a strain relaxation layer is allowed to undergo epitaxial growth, making it impossible to sufficiently relax strain. On the contrary, when the width of the island-patterned silicon layer is more than 1,000 nm, the density of threading dislocation generated by the island-patterned silicon layer is reduced, making it impossible to sufficiently relax strain to disadvantage. Accordingly, it is preferred that the width of the island-patterned silicon layer be from 10 nm to 1,000 nm.

The tenth invention according to the ninth aspect of the present invention concerns a manufacturing method for a silicon substrate having a strained layer, wherein the island-patterned silicon layers are formed at an interval ranging from 100 nm to 1,000 nm.

Thus, since the island-patterned silicon layer comprises islands formed at a predetermined interval, the adjacent silicon islands cannot be connected to each other, making it possible to prevent the piling-up of threading dislocation and misfit dislocation to the upper layers and form a suitable strain relaxation layer on the island-patterned silicon layer.

The eleventh invention according to the ninth aspect of the present invention concerns a manufacturing method for a silicon substrate having a strained layer, wherein the stain relaxation layer is a layer obtained by allowing any of silicon-germanium, silicon carbide and silicon nitride to undergo epitaxial growth.

The twelfth invention according to the ninth aspect of the present invention concerns a manufacturing method for a silicon substrate having a strained layer, wherein a step of forming a thin oxide layer having a thickness of 10 nm or less on the monocrystalline silicon substrate is provided before the step of forming the island-patterned silicon layer on the monocrystalline silicon substrate.

The thirteenth invention according to the ninth aspect of the present invention concerns a manufacturing method for a silicon substrate having a strained layer, wherein the stain relaxation layer has a thickness ranging from 50 nm to 150 nm.

The fourteenth invention according to the eleventh aspect of the present invention concerns a manufacturing method for a silicon substrate having a strained layer, wherein the atomic concentration ratio of germanium in silicon-germanium in the strain relaxation layer is from 0.5 to 0.7.

The fifteenth invention according to the eleventh aspect of the present invention concerns a manufacturing method for a silicon substrate having a strained layer, wherein the atomic concentration ratio of carbon in silicon carbide in the strain relaxation layer is from 0.01 to 0.02.

The sixteenth invention according to the eleventh aspect of the present invention concerns a manufacturing method for a silicon substrate having a strained layer, wherein the atomic concentration ratio of nitrogen in silicon nitride in the strain relaxation layer is from 0.3 to 0.5.

DETAILED DESCRIPTION OF THE PREFERRED EMBODIMENT

A manufacturing method for a silicon substrate having a strained layer according to the invention comprises forming a SiGe layer or a SiGe layer and a Si layer on a silicon substrate having an atomic step and a terrace structure formed thereon.

An ordinary silicon (100) surface substrate undergoes threading dislocation (60° dislocations) predominantly and thus tends to have an increasing threading dislocation density.

In the invention, on the other hand, the formation of a SiGe layer on a silicon substrate having a regularly formed step and terrace structure makes 90° dislocations predominant. Therefore, dislocation moves on the interface of the silicon substrate with the SiGe layer to raise the Ge content in the SiGe layer, making it possible to relax strain even it the thickness of the SiGe layer is reduced.

Figure 1:
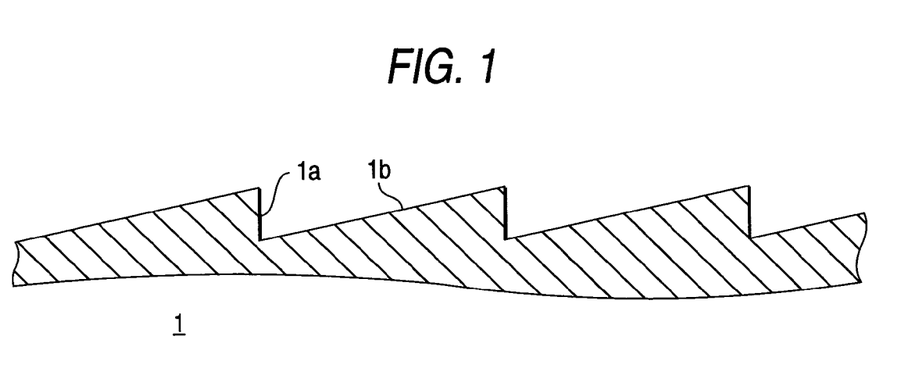
FIG. 1 is a sectional view of typical illustration of a silicon substrate having a step and terrace structure.

FIG. 1 is a typical illustration of the step and terrace structure on the surface of the silicon substrate to be used in the invention.

On the surface of a silicon substrate 1 shown in FIG. 1 are formed a step 1a composed of several atomic layers and a terrace 1b controlled by the misorientation angle of Si (100) substrate.

The aforementioned step and terrace structure is formed by annealing a silicon substrate at a high temperature.

The silicon substrate which has been subjected to high temperature heat treatment (1,000° C. to 1,200° C.) with hydrogen gas or an inert gas such as Ar has a step composed of 1 to 3 atoms and a terrace formed on the surface thereof due to the movement of Si atom during heat treatment. The width of the terrace is increased by reducing the misorientation angle of Si (100) substrate, making it possible to render the surface of the silicon substrate flat on the atomic level.

The aforesaid silicon substrate which has been annealed can be subjected to cleaning with a functional water such as ozonized water and HF solution to obtain a clean silicon substrate the atomic step and terrace structure of which is maintained.

The aforesaid step and terrace structure may be formed in a prebake treatment during the subsequent formation of SiGe layer in an epitaxial growth furnace instead of the aforesaid annealing so far as the process is not troubled or the product is not contaminated.

When an SiGe layer is allowed to undergo epitaxial growth on the silicon substrate having a step and terrace structure formed on the surface thereof, the step site can easily act as a site for reaction of epitaxial layer material, causing the selective epitaxial growth.

In general, when a dimmer structure is formed on the surface of a restructured material, a compressive stress field occurs at the end of the step because an anisotropic internal stress occurs in the plane.

On the other hand, a tensile stress field occurs with Si constituting the substrate on SiGe/Si interface due to lattice mismatching. Thus, strain generated by the difference in lattice constant between Si and Ge is higher at the end of the step.

In the invention, the strain field in the vicinity of the step is utilized to relax the strain of the SiGe layer.

An ordinary silicon substrate has an irregularly roughened surface. Thus, the starting point of dislocation is indefinite, giving an uneven distribution of dislocations having various sizes.

On the other hand, the step and terrace structure according to the invention is formed on the silicon substrate in a uniformly controlled manner. Thus, the regularly formed step acts to relax dislocation, preventing the movement of dislocation.

Accordingly, the distance between these steps and the density of steps can be controlled to control strain attributed to lattice mismatching of the SiGe layer in the plane of the silicon substrate, making it possible to form an SiGe layer having a laterally expanded lattice while relaxing the strain.

From the standpoint of relaxation of strain, it is preferred that the distance between the steps be 0.1 µm or more.

Further, another manufacturing method for a silicon substrate having a strained layer comprises forming an SiGe layer or an SiGe layer and an Si layer on a silicon substrate having a plurality of protrusions made of crystalline silicon.

In accordance with the aforesaid process, regularly formed protrusions formed on a silicon substrate are utilized instead of the aforesaid step and terrace structure to relax the strain of the SiGe layer similarly.

By subjecting a silicon substrate to annealing with hydrogen or Ar and then to cleaning with ozonized water and HF solution, protrusions of crystalline silicon attributed to crystal defect are formed on the silicon substrate.

Figure 2:
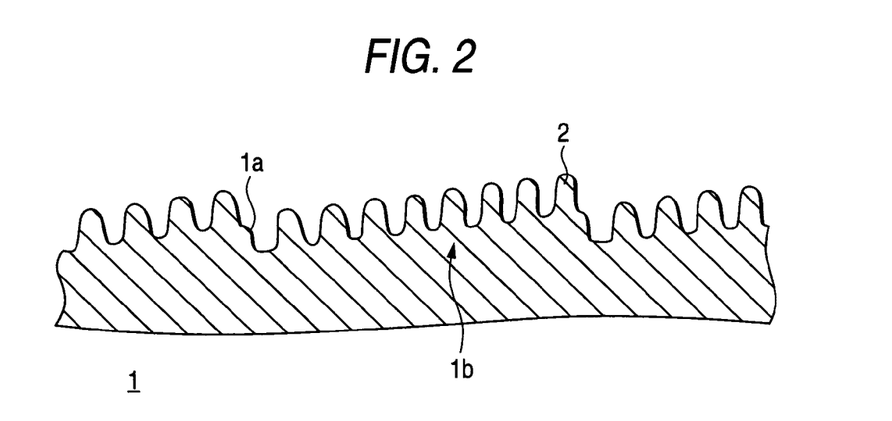
FIG. 2 is a sectional view of typical illustration of a silicon substrate having a step and terrace structure comprising protrusions of crystalline silicon provided on the surface thereof.

FIG. 2 is a typical illustration of protrusions 2 of crystalline silicon formed on the surface of a silicon substrate 1 having a step and terrace structure.

The protrusions 2 are regularly formed. While the silicon substrate 1 having a step and terrace structure is shown with protrusions 2 having a greater height than between the step formed thereon in FIG. 2, the presence of such a step and terrace structure is not questioned. It is important that the protrusions 2 are uniformly formed.

When a SiGe layer is allowed to undergo epitaxial growth on the aforesaid silicon substrate having protrusions formed on the surface thereof, the protrusions can easily act as sites for reaction of epitaxial material, causing the selective epitaxial growth. Thus, the SiGe layer is formed on the protrusions to a greater thickness. Accordingly, the strain generated by the difference in lattice constant between Si and Ge is greater at the protrusions.

In other words, strains having various magnitudes are uniformly dispersed in the plane of the silicon substrate to produce an action of relaxing local strain, making it possible to form a SiGe layer the lattice of which is expanded such that strain can be difficultly accumulated.

Accordingly, the generation of threading dislocation can be inhibited, making it possible to reduce the thickness of the SiGe layer.

The shape and density of the protrusion of crystalline silicon can be controlled by adjusting the time required for cleaning with HF. In the invention, from the standpoint of relaxation of the aforesaid stain, it is preferred that the protrusion be formed having a height of from 0.2 nm to 1.0 nm, a width of from 10 nm to 150 nm and an in-plane density of from $1 \times 10^{19}$ to $5 \times 10^{10}/cm^2$.

The aforementioned protrusions can be removed by prolonging the HF cleaning time during cleaning of the silicon substrate with ozonized water and HF solution after annealing to obtain a flat terrace surface free of protrusion.

On the other hand, in the case where some protrusions are left unremoved after cleaning with ozonized water and HF solution, the silicon substrate can be cleaned with ozonized water to oxidize the surface of the silicon substrate at the protrusions.

Accordingly, by controlling the HF cleaning time such that protrusions having a predetermined shape and density are formed on the terrace surface and then cleaning the silicon substrate with ozonized water, only the protrusions can be oxidized.

When a SiGe layer is allowed to undergo epitaxial growth on the aforesaid silicon substrate having only protrusions selectively oxidized, Ge undergoes selective epitaxial growth on the hydrogen-terminated surface, i.e., sites other than the protrusions.

The strain generated by the difference in lattice constant between Si and Ge during this procedure is greater at the sites other than the protrusions. However, since protrusions protected by an oxide layer are present in the vicinity of these sites, the strain can be relaxed by the oxide layer on the surface of the protrusions. Therefore, a SiGe layer the lattice of which is expanded in such an arrangement that strain can be difficultly accumulated can be formed.

Accordingly, also in the case where the oxidation of only the protrusions is followed by the formation of an SiGe layer, the generation of dislocation can be inhibited, making it possible to reduce the thickness of the SiGe layer.

Ge which has thus undergone selective epitaxial growth then under goes epitaxial growth to several atoms (about 6 atoms). However, when epitaxial growth continues, Ge forms an island pattern.

Since the protrusion of crystalline silicon consists of several atomic layers, the shape and density of the protrusions can be properly controlled to allow Si protrusions and island-patterned Ge to occur homogeneously in plane in a predetermined proportion.

In other words, since strains having various magnitudes are uniformly dispersed in the plane of the substrate, an action of relaxing local strain occurs, making it possible to form an SiGe layer the lattice of which is expanded in such an arrangement that strain can be difficultly accumulated.

Accordingly, also in the case where the epitaxial growth of Ge in an island pattern on the sites other than the oxidized protrusions of crystalline silicon is followed by the formation of an SiGe layer, the generation of threading dislocation can be inhibited, making it possible to reduce the thickness of the SiGe layer.

In the aforementioned oxidation by cleaning with ozonized water, it is preferred that the oxide layer has been completely removed from the silicon substrate at the previous step of HF cleaning.

In the aforementioned process, only the regularly formed protrusions are selectively oxidized to relax the strain of the SiGe layer. Thus, it is not desirable that an oxide layer be formed on the sites other than the protrusions.

The invention will be further described in connection with FIG. 6, which is a schematic sectional view of a semiconductor substrate obtained according to the process of the invention. The present embodiment will be described with reference to the case where a SiGe layer is formed as a strain relaxation layer.

As the monocrystalline silicon substrate to be used in the process of the invention there is preferably used a P-type boron-doped substrate cut out of a monocrystalline ingot withdrawn by Czochralski method, i.e., Si prime substrate having orientation (100), a resistivity of 0.1 Ωcm or more and an initial oxygen concentration of $15 \times 10^{17}$ atom s/cm$^3$ or less. It goes without saying that substrates other CZ such as FZ substrate can be used as well.

Figure 6:
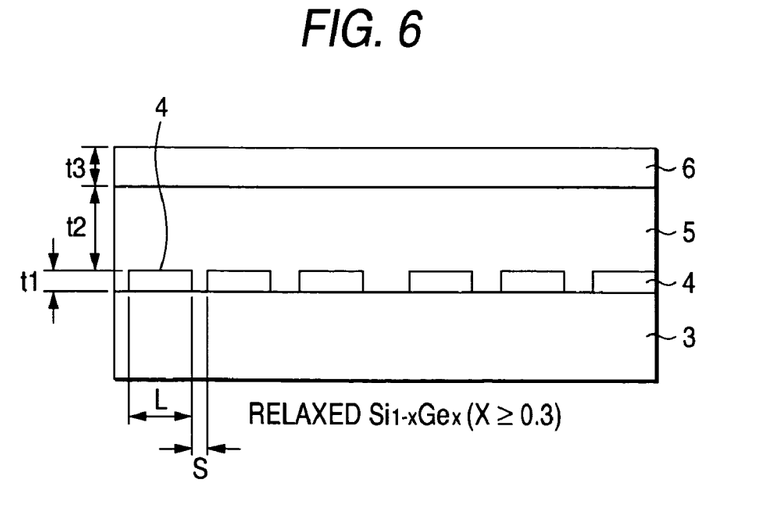
FIG. 6 is a schematic sectional view of a strained silicon substrate wafer obtained in an embodiment of implementation of the invention.

Subsequently, as shown in FIG. 6, in the process of the invention, an island-patterned silicon layer 4 having a predetermined thickness on which the epitaxial growth of SiGe can be made is formed on the surface of the silicon substrate 3 without transmitting threading dislocation or misfit dislocation to upper other layers.

In some detail, the island-patterned silicon layer 4 is formed to a thickness t1 of preferably from about 10 to 400 nm, particularly from 100 to 300 nm.

Further, the island-patterned silicon layer 4 is formed with a width L of preferably from about 10 nm to 1,000 nm, particularly from 100 nm to 300 nm.

Moreover, it is desired that the island-patterned silicon layers be formed at an interval of from 100 nm to 1,000 nm.

When an SiGe layer 5 is allowed to undergo epitaxial growth as a strain relaxation layer on the surface of the island-patterned silicon layer 4 having such a predetermined dimension which has been formed on the silicon substrate 3, crystal defects such as dislocation generated during epitaxial growth are moved along the interface of the island-patterned silicon layer 4 with the SiGe layer 5 or through the interior of the island-patterned silicon layer 4 rather than in the direction of growth of the SiGe layer 5.

This is presumably because the latter movement is more stable on energy basis than that in the growth direction.

The formation of the island-patterned silicon layer 4 is preferably accomplished by CVD method, but the method of forming the island-patterned silicon layer 4 is not limited thereto. Any of evaporation method and PVD method may be used so far as a homogeneous island-patterned silicon layer 4 having the above defined thickness can be formed. In particular, in order to form a silicon layer in an island pattern, CVD method, if employed, is preferably effected such that a gas having a high supersaturation of silicon forms silicon nuclei in a gas phase while the rate of growth of the silicon layer 4 is as high as 10 μm/minutes and the silicon nuclei are then attached to the silicon substrate to form an island pattern thereon.

Further, in the process of the invention, the island-patterned silicon layer 4 may be formed on a thin oxide layer having a thickness of 10 nm or less formed on the silicon substrate 3 rather than directly on the surface of the silicon substrate 3. This method is desired because stabilization and elimination of contamination by metal can be made.

Subsequently, a SiGe layer 5 is formed on the island-patterned silicon layer 4 to a thickness t2 of preferably from 10 nm to 200 nm, more preferably from 50 nm to 150 nm.

When the thickness of the SiGe layer 5 is less than 10 nm, the strain given to the Si layer 6 is insufficient. When the thickness of the SiGe layer 5 is more than 200 nm, the desired strain remains much the same. Therefore, the thickness t2 of the SiGe layer 5 formed on the island-patterned silicon layer 4 is preferably from 10 nm to 200 nm.

Further, the atomic concentration ratio of Ge in the SiGe layer 5 thus formed is preferably 0.3 or more, particularly from 0.5 to 0.7 from the standpoint of formation of proper strain of Si layer which is allowed to grown on the SiGe layer 5 (eventually related to properties such as carrier mobility of device formed therein).

The epitaxial growth of the SiGe layer 5 is accomplished by a gas phase epitaxial method such as CVD method involving lamp heating and CVD method in ultrahigh vacuum (UHV-CVD), a molecular beam epitaxial method (MBE) or the like.

The growth conditions depend on the composition ratio of Si:Ge in the SiGe layer 5, the thickness of layer, the growth method and apparatus used, etc. and are properly predetermined. For example, referring to CVD method involving lamp heating by way of example, the growth conditions are as follows if the composition ratio of Ge is 0.3.

Carrier gas: $H_2$, Starting material gas: $SiH_4$, $GeH_4$, chamber pressure: 10 to 100 Torr, temperature: 650° C. to 680° C., growth rate: 10 to 50 nm/minutes It is preferred that the surface of the SiGe layer 5 be then subjected to high temperature hydrogen heat treatment (in the stream of $H_2$; 850° C. to 1,200° C.; pressure: approx. 10 to 760 Torr) so that it is smoothened.

A monocrystalline Si layer is then allowed to grow on the surface of the SiGe layer 5 thus obtained by, e.g., CVD method.

The monocrystalline Si layer thus formed acts as a strain Si layer 6 because it differs from the underlying SiGe layer 5 in lattice constant. This strain Si layer forms a device active region and thus preferably has a thickness of from 10 nm to 50 nm.

An example of the conditions under which the monocrystalline Si is thus formed by CVD method will be described below.

Carrier gas: $H_2$, Starting material gas: $SiH_2Cl_2$ or $SiH_4$, chamber pressure: 10 to 760 Torr, temperature: 650° C. to 1,000° C.

While the present embodiment has been described with reference to the case where a SiGe layer is formed as strain relaxation layer, the invention is not limited thereto. The strain relaxation layer may be a layer formed by allowing either silicon carbide or silicon nitride to undergo epitaxial growth.

The silicon carbide or silicon nitride layer is formed to a thickness of preferably from 10 nm to 200 nm, more preferably from 50 nm to 150 nm similarly to SiGe layer 5.

The atomic concentration ratio of C (carbon) in the silicon carbide layer thus formed is preferably 0.02 or less, particularly from 0.01 to 0.02 from the standpoint of formation of proper strain of Si layer which is allowed to grown on the silicon carbon layer (eventually related to properties such as carrier mobility of device formed therein).

Similarly, the atomic concentration ratio of N (nitrogen) in the silicon nitride layer is preferably 0.1 or more, particularly from 0.3 to 0.5.

The epitaxial growth of the silicon carbide layer or silicon nitride layer is accomplished by a gas phase epitaxial method such as CVD method involving lamp heating and CVD method in ultrahigh vacuum (UHV-CVD), a molecular beam epitaxial method (MBE) or the like.

The growth conditions depend on the composition ratio of Si:C in the silicon carbide layer or the composition ratio of Si:N in the silicon nitride layer, the thickness of layer, the growth method and apparatus used, etc. and are properly predetermined.

EMBODIMENT EXAMPLE

The invention will be further described hereinafter in the following examples, but the invention is not construed as being limited thereto.

Embodiment 1

A finally-polished 8-inch (100) P-type silicon wafer having a misorientation angle of 0.001° in the direction of <100> which had been annealed was cleaned with 20 ppm ozonized water for 30 seconds, cleaned with 1% HF solution for 60 seconds, and then cleaned with 20 ppm ozonized water for 30 seconds so that it was oxidized on the surface thereof.

The surface of the wafer thus cleaned was then measured for step width and surface roughness under an atomic force microscope (AFM) (3 μm×3 μm). As a result, the surface roughness Rms and the step width were found to be 0.08 nm and 1.0 μm, respectively.

Subsequently, the silicon wafer was prebaked at 750° C. in a hydrogen atmosphere to remove spontaneous oxide layer from the surface thereof.

Using a mixture of $SiH_4$ gas and $GeH_4$ gas, SiGe (Ge composition ratio: 20%) was then allowed to undergo epitaxial growth on the surface of the silicon wafer at 500° C. in a vacuum CVD apparatus.

Thus, a SiGe layer was formed to a thickness of 500 nm and 1,000 nm. A Si layer was then allowed to undergo epitaxial growth on the SiGe layer to a thickness of 50 nm to form a strain Si layer.

The various silicon wafers having different SiGe layer thicknesses were each then subjected to secco etching. The surface (100 μm×100 μm) of the strain Si layer formed on the various SiGe layers were each evaluated for threading dislocation density.

Figure 3:
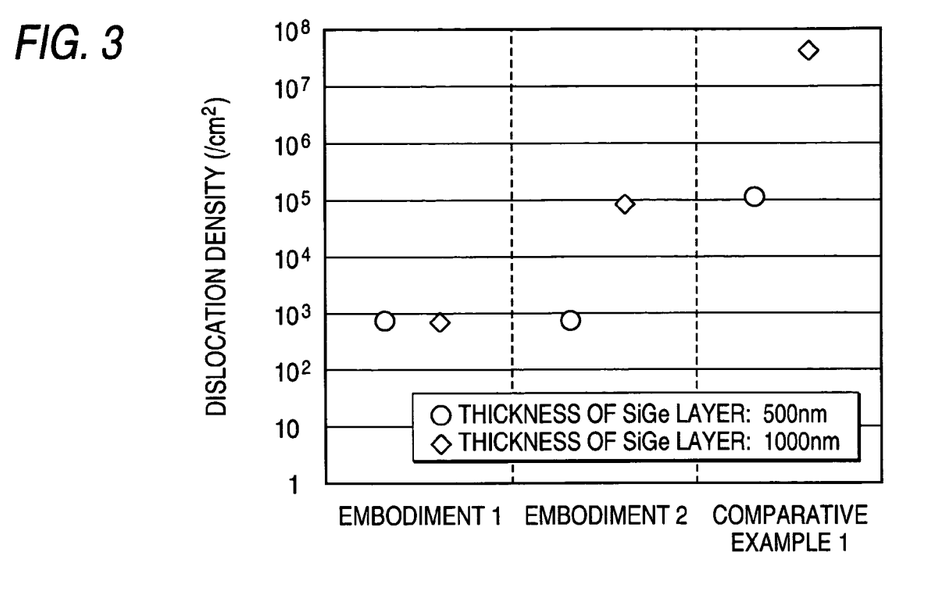
FIG. 3 is a graphic illustration of the measurements of threading dislocation density in embodiments 1 and 2 and comparative example 1.

The results are shown in FIG. 3.

Embodiment 2

The cleaning procedure of Embodiment 1 was followed except that an annealed silicon wafer having a misorientation angle of 0.001° in the direction of <100> was used. The silicon wafer thus cleaned was then measured for step width and surface roughness Rms. As a result, the surface roughness Rms and the step width were found to be 0.08 nm and 0.3 μm, respectively.

A SiGe layer and a strain Si layer were then formed on the silicon wafer in the same manner as in Embodiment 1. The silicon wafer was then evaluated for threading dislocation density.

The results are shown in FIG. 3.

Comparative Example 1

The procedure of Embodiment 1 was followed except that a finally-polished silicon wafer which had not been annealed was used. The silicon wafer thus treated was then measured for step width and surface roughness in the same manner as in Embodiment 1. As a result, the surface roughness was found to be 0.25 μm and no steps and no terraces were observed formed.

A SiGe layer and a strain Si layer were then formed on the silicon wafer in the same manner as in Embodiment 1. The silicon wafer was then evaluated for threading dislocation density.

The results are shown in FIG. 3.

As shown in FIG. 3, in the case where the thickness of SiGe layer is 500 nm, the silicon wafer free of step and terrace structure (Comparative Example 1) showed a great threading dislocation density.

On the other hand, the silicon wafers having a step and terrace structure (Embodiments 1 and 2) were recognized capable of reducing its threading dislocation density by controlling the step width.

Embodiment 3

A finally-polished 8-inch (100) P-type silicon wafer having a misorientation angle of 0.04° in the direction of <100> which had been annealed at 1,200° C. in a hydrogen atmosphere for 1 hour was cleaned with 20 ppm ozonized water for 30 seconds, and then cleaned with 1% HF solution to form protrusions of crystalline silicon on the surface thereof.

The silicon wafer was then cleaned with 20 ppm ozonezed water for 30 seconds to oxidize the surface thereof.

The surface of the wafer thus cleaned was then measured for protrusion density on the surface thereof and surface roughness under an atomic force microscope (AFM) (3 μm×31 μm). The protrusion density was then calculated. As a result, the surface roughness Rms and the protrusion density were found to be 0.14 nm and $3\times10^{10}/cm^2$, respectively.

Subsequently, the silicon wafer was prebaked at 750° C. in a hydrogen atmosphere to remove spontaneous oxide layer from the surface thereof.

Using a mixture of $SiH_4$ gas and $GeH_4$ gas, SiGe (Ge composition ratio: 20%) was then allowed to undergo epitaxial growth on the surface of the silicon wafer in a vacuum CVD apparatus.

Thus, a SiGe layer was formed to a thickness of 500 nm and 1,000 nm. A Si layer was then allowed to undergo epitaxial growth on the SiGe layer to a thickness of 50 nm to form a strain Si layer.

The various silicon wafers having different SiGe layer thicknesses were each then subjected to secco etching. The surface (100 μm×100 μm) of the strain Si layer formed on the various SiGe layers were each evaluated for threading dislocation density.

Figure 4:
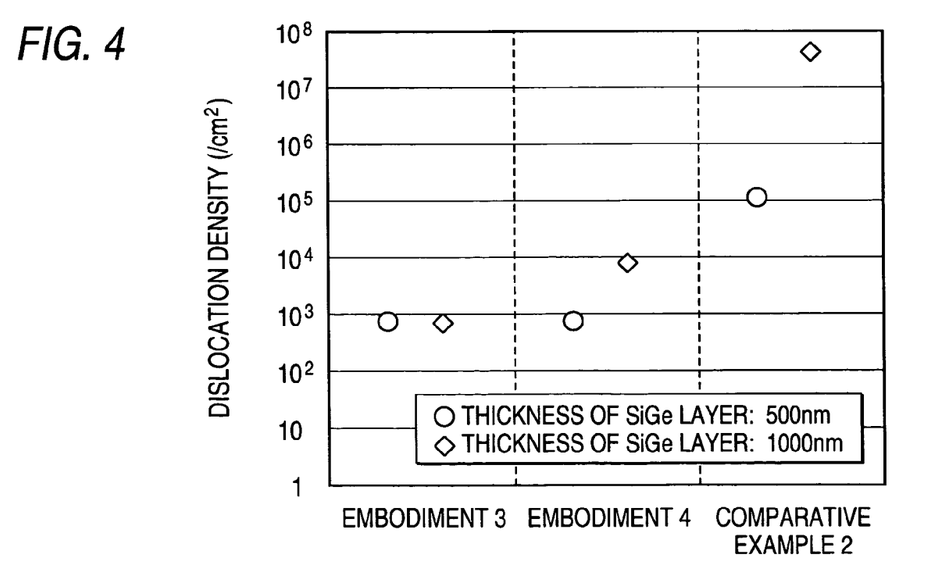
FIG. 4 is a graphic illustration of the measurements of threading dislocation density in embodiments 3 and 4 and comparative example 2.

The results are shown in FIG. 4.

Embodiment 4

A silicon wafer which had been subjected to cleaning in the same manner as in Embodiment 3 except that the time of cleaning with 1% HF solution was varied was measured for protrusion density on the surface thereof and surface roughness Rms under AFM (3 μm×3 μm). The protrusion density was then calculated. As a result, the surface roughness Rms and the protrusion density were found to be 0.08 nm and $1.3\times10^{10}/cm^2$, respectively.

An SiGe layer and a strain Si layer were then formed on the silicon wafer in the same manner as in Embodiment 3. The silicon wafer was then evaluated for threading dislocation density.

The results are shown in FIG. 4.

Comparative Example 2

The procedure of Embodiment 3 was followed except that a finally-polished silicon wafer which had not been annealed was used. The silicon wafer thus treated was then measured for protrusion density and surface roughness. As a result, the surface roughness Rms was found to be 0.25 nm. No protrusions were observed.

A SiGe layer and a strain Si layer were then formed on the silicon wafer in the same manner as in Embodiment 3. The silicon wafer was then evaluated for threading dislocation density.

The results are shown in FIG. 4.

As shown in FIG. 4, in the case where the thickness of SiGe layer is 500 nm, the silicon wafer having no protrusions of crystalline silicon formed on the surface thereof (Comparative Example 2) showed a great threading dislocation density.

On the other hand, the silicon wafers having protrusions of crystalline silicon formed thereon (Embodiments 3 and 4) were recognized capable of reducing its threading dislocation density more as the protrusion density increases.

Embodiment 5

The same annealed silicone wafer as used in Embodiment 3 was subjected to cleaning with ozonized water and HF solution and then with ozonized water in the same manner as in Embodiment 3 so that only the protrusions of crystalline silicon were oxidized.

In order to prevent the growth of spontaneous oxide layer, the silicon wafer thus cleaned was immediately allowed to undergo epitaxial growth of SiGe (Ge composition ratio:

20%) thereon at 500° C. using a mixture of SiH$_4$ gas and GeH$_4$ gas in a vacuum CVD apparatus.

A SiGe layer (thickness: 1,000 nm) and a strain Si layer were then formed on the silicon wafer in the same manner as in Embodiment 3. The silicon wafer was then evaluated for threading dislocation density.

Figure 5:
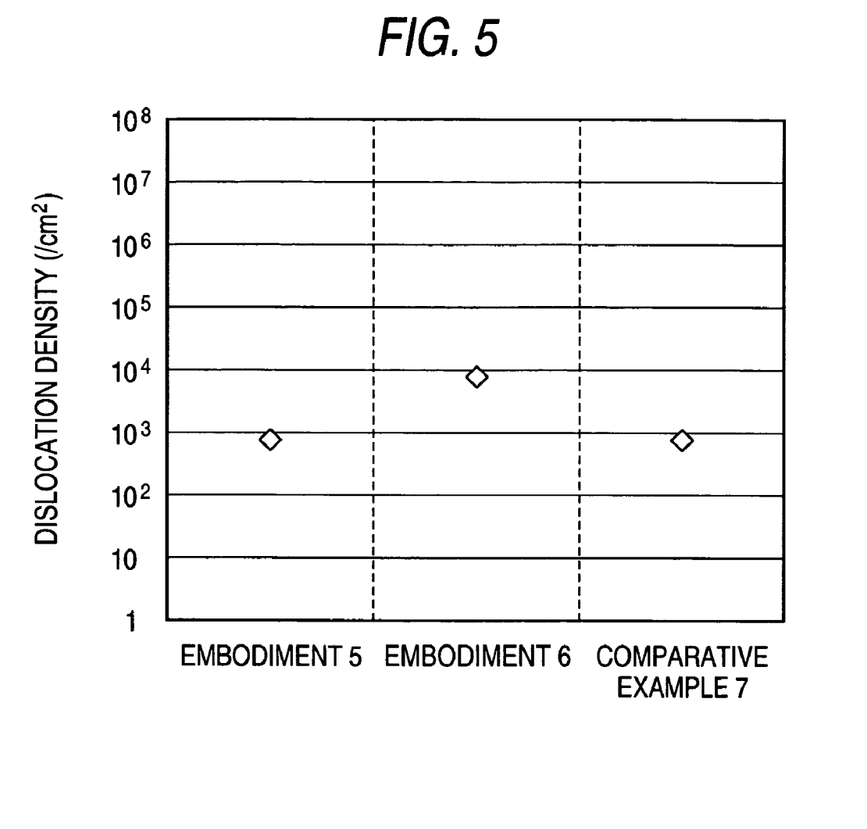
FIG. 5 is a graphic illustration of the measurements of threading dislocation density in embodiments 5 to 7.

The results are shown in FIG. 5.

Embodiment 6

The same annealed silicone wafer as used in Embodiment 4 was subjected to cleaning with ozonized water and HF solution and then with ozonized water in the same manner as in Embodiment 3 so that only the protrusions of crystalline silicon were oxidized.

In order to prevent the growth of spontaneous oxide layer, the silicon wafer thus cleaned was immediately allowed to undergo epitaxial growth of SiGe (Ge composition ratio: 20%) thereon at 500° C. using a mixture of SiH$_4$ gas and GeH$_4$ gas in a vacuum CVD apparatus.

A SiGe layer (thickness: 1,000 nm) and a strained Si layer were then formed on the silicon wafer in the same manner as in Embodiment 4. The silicon wafer was then evaluated for threading dislocation density.

The results are shown in FIG. 5.

Embodiment 7

The same annealed silicone wafer as used in Embodiment 4 was subjected to cleaning with ozonized water and HF solution and then with ozonized water in the same manner as in Embodiment 3 so that only the protrusions of crystalline silicon were oxidized.

In order to prevent the growth of spontaneous oxide layer, the silicon wafer thus cleaned was immediately allowed to undergo epitaxial growth of Ge thereon to a thickness of 2 nm using GeH$_4$ gas in a vacuum CVD apparatus. As a result, Ge was formed in an island pattern on sites other than the protrusions protected by an oxide layer.

Thereafter, a SiGe layer (thickness: 1,000 nm) and a strain Si layer were then formed on the silicon wafer in the same manner as in Embodiment 4. The silicon wafer was then evaluated for threading dislocation density.

The results are shown in FIG. 5.

As shown in FIG. 5, it was confirmed that even in the case where the silicon wafer is not prebaked (Embodiment 5 and 6), the greater the density of protrusions of crystalline silicon formed on the surface of the silicon substrate is, the less is the threading dislocation density.

It was also confirmed that threading dislocation could be further inhibited by oxidizing only the protrusions to form an island-patterned Ge layer.

Embodiment 8, Comparative Example 3

As a silicon substrate there was used a CZ process P-type (boron) silicon substrate having orientation (100), a resistivity of 1.0 Ωcm and an initial oxygen concentration of 10×10$^{17}$ atoms/cm$^3$. Island-patterned silicon layers having different thicknesses were then formed on 8 points having a size of from 5 nm to 1,000 nm on the silicon substrate using CVD method.

A SiGe layer was then allowed to undergo epitaxial growth to a thickness of 100 nm on the substrate having these island-patterned silicon layers formed thereon.

Figure 7:
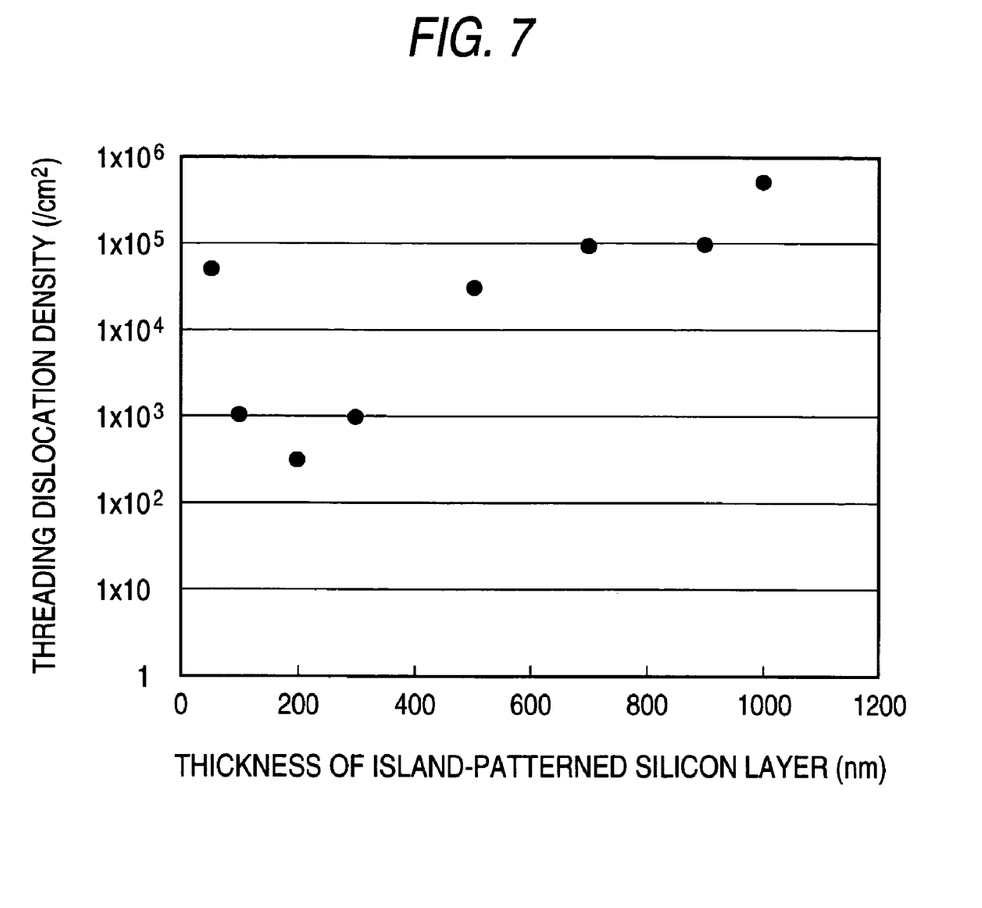
FIG. 7 is a diagram illustrating the threading dislocation density of SiGe layer every thickness of island-patterned silicon layer on the sample substrates (8 points) in the embodiments and comparative examples.

FIG. 7 illustrates the threading dislocation density in the SiGe layer every thickness of amorphous Si of sample on the 8 points.

As can be seen in FIG. 7, when the thickness of the island-patterned silicon layer is less than 5 nm, dislocation is moved not only to the island-patterned silicon layer/SiGe layer interface, providing a threading dislocation density of close to 1.0×10$^5$/cm$^2$. However, as the thickness of the island-patterned silicon layer increases, the threading dislocation density suddenly decreases.

Then, when the thickness of the island-patterned silicon layer is 100 nm or more, a sufficiently low dislocation density can be obtained.

On the contrary, it is also apparent that when the thickness of the island-patterned silicon layer is more than 300 nm, the growth of polycrystalline SiGe is observed and the dislocation density is raised.

For comparison, a SiGe layer was allowed to undergo epitaxial growth to a thickness of 3 μm on the porous Si surface of a substrate having a porous Si layer by direct CVD method.

The SiGe layer had a dislocation density of 3×10$^5$/cm$^2$.

As described in detail above, the strained silicon substrate wafer prepared according to the process of the invention has an extremely low threading dislocation density or other dislocation densities in the strain relaxation layer and hence a sufficient strain relaxation. Therefore, the strained silicon substrate layer formed on the silicon wafer, too, has a good quality.

Accordingly, the strained silicon substrate wafer prepared according to the process of the invention is sufficiently useful as a substrate for forming next-generation or following generation LSI's and individual semiconductor devices required to have extremely high speed performance.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

In accordance with the production process according to the invention, a process for the production of a semiconductor substrate comprising a strained layer having a reduced thickness and a strain relaxation layer having less dislocation and having a reduced threading dislocation density can be obtained. This also makes it possible to reduce the production cost of semiconductor substrate having a SiGe layer and enhance the production efficiency.

Further, the semiconductor substrate having a Si layer obtained by the production process according to the invention comprises a Si layer having a low dislocation density and a high quality formed thereon. Accordingly, the use of the Si layer as a channel region makes it possible to raise the carrier mobility and hence make contribution to further atomization of and enhancement of performance of semiconductor element.

What is claimed is:

1. A manufacturing method for a silicon substrate having a strained layer, comprising steps of:
    forming a plurality of atomic steps having a height of 0.1 nm or more on the surface of a silicon substrate;
    forming a plurality of terraces having a width of 0.1 μm or more between the plurality of atomic steps; and
    forming a SiGe layer or a SiGe layer and a Si layer on the silicon substrate, wherein the plurality of steps and plurality of terrace structures on the surface of the silicon substrate are formed at heat treatment, and wherein a threading dislocation density on a surface of the SiGe layer or the SiGe layer and the Si layer is $10^4/cm^2$ or less.

2. A manufacturing method for a silicon substrate having a strained layer comprising steps of:

forming a plurality of protrusions made of crystalline silicon on a silicon substrate;

forming an SiGe layer or an SiGe layer and an Si layer on the silicon substrate; and a step of cleaning with ozonized water and HF solution to form the crystalline silicon protrusions on the silicon substrate after subjecting the silicon substrate to hydrogen or Ar annealing at a high temperature.

3. A manufacturing method for a silicon substrate having a strained layer as set forth in claim 2, wherein the protrusions of crystalline silicon have a height ranging from 0.2 nm to 1.0 nm, a width ranging from 10 nm to 150 nm and an in-plane density ranging from $1\times10^{19}$ to $5\times10^{10}/cm^2$.

4. A manufacturing method for a silicon substrate having a strained layer as set forth in claim 2, further comprising a step of forming a strained layer after oxidizing the protruding portion of the crystalline silicon.

5. A manufacturing method for a silicon substrate having a strained layer as set forth in claim 6, further comprising a step of forming a strain relaxation layer after allowing Ge to undergo epitaxial growth in island pattern at sites other than the protruding portion of the oxidized crystalline silicon.

6. A manufacturing method for a silicon substrate having a strained layer as set forth in claim 4, further comprising a step of subjecting the silicon substrate to cleaning with ozonized water to oxidize the protruding portion of the crystalline silicon after subjecting the silicon substrate to cleaning with HF solution to remove the oxide layer.

7. A manufacturing method for a silicon substrate having a strained layer including a island-patterned silicon layer, a strain relaxation layer and a silicon layer having a lattice strain formed on a monocrystalline silicon substrate in this order, comprising steps of:

forming an island-patterned layer having a thickness ranging from 10 nm to 400 nm and a width ranging from 10 nm to 1,000 nm on a monocrystalline silicon substrate;

allowing a strain relaxation layer to undergo epitaxial growth on the island-patterned silicon layer to a thickness ranging from 10 nm to 200 nm; and forming a strained silicon layer having lattice strain on the strain relaxation layer to a thickness ranging from 10 nm to 50 nm, wherein a threading dislocation density on a surface of the SiGe layer or the SiGe layer and the Si layer is $10^4/cm^2$ or less.

8. A manufacturing method for a silicon substrate having a strained layer as set forth in claim 7, wherein the island-patterned silicon layers are formed at an interval ranging from 100 nm to 1,000 nm.

9. A manufacturing method for a silicon substrate having a strained layer as set forth in claim 7, wherein the strain relaxation layer is a layer obtained by allowing silicon-germanium to undergo epitaxial growth.

10. A manufacturing method for a silicon substrate having a strained layer as set forth in claim 7, wherein a step of forming a thin oxide layer having a thickness of 10 nm or less on the monocrystalline silicon substrate is provided before the step of forming the island-patterned silicon layer on the monocrystalline silicon substrate.

11. A manufacturing method for a silicon substrate having a strained layer as set forth in claim 7, wherein the strain relaxation layer has a thickness ranging from 50 nm to 150 nm.

12. A manufacturing method for a silicon substrate having a strained layer as set forth in claim 9, wherein the atomic concentration ratio of germanium in silicon-germanium in the strain relaxation layer is from 0.5 to 0.7.

* * * * *